(12) United States Patent
De Steur et al.

(10) Patent No.: US 6,833,528 B2
(45) Date of Patent: Dec. 21, 2004

(54) METHOD AND APPARATUS FOR LASER PROCESSING

(75) Inventors: Hubert De Steur, Drongen (BE); Eddy Roelants, Bruges (BE)

(73) Assignee: Siemens Aktiengesellschaft, Munich (DE)

( * ) Notice: Subject to any disclaimer, the term of this patent is extended or adjusted under 35 U.S.C. 154(b) by 103 days.

(21) Appl. No.: 10/378,884

(22) Filed: Mar. 5, 2003

(65) Prior Publication Data

US 2003/0168435 A1 Sep. 11, 2003

(30) Foreign Application Priority Data

Mar. 5, 2002 (DE) .......................................... 102 09 617

(51) Int. Cl.⁷ ........................... B23K 26/38; H05K 3/46
(52) U.S. Cl. ............................................... 219/121.71
(58) Field of Search .......... 219/121.61, 121.67–121.72, 219/121.85; 216/65, 66, 94; 264/400; 427/554, 555; 29/846, 852

(56) References Cited

U.S. PATENT DOCUMENTS

| | | | |
|---|---|---|---|
| 4,027,137 A | * 5/1977 | Liedtke | .................... 219/121.7 |
| 4,044,222 A | 8/1977 | Kestenbaum | |
| 5,493,096 A | * 2/1996 | Koh | ....................... 219/121.71 |
| 5,593,606 A | 1/1997 | Owen et al. | |
| 6,150,630 A | 11/2000 | Perry et al. | |
| 6,452,132 B1 | * 9/2002 | Fuse | ....................... 219/121.7 |
| 6,576,869 B1 | * 6/2003 | Gower et al. | .......... 219/121.71 |

FOREIGN PATENT DOCUMENTS

| | | |
|---|---|---|
| DE | 10020559 A1 | 10/2001 |
| EP | 0 884 128 A1 | 12/1998 |
| GB | 2 286 787 A | 8/1995 |
| WO | WO 02/090037 A1 | 11/2002 |
| WO | WO 03/026367 A1 | 3/2003 |

* cited by examiner

Primary Examiner—Samuel M. Heinrich
(74) Attorney, Agent, or Firm—Harness, Dickey & Pierce, P.L.C.

(57) ABSTRACT

A method and an apparatus are for rapidly processing dielectric substrates using laser beams. A pulsed laser beam having a pulse repetition frequency greater than approximately 50 kHz and having pulse lengths shorter than approximately 200 ns is used for this purpose. Given a suitable choice of the parameters which characterize the processing laser beam, it is possible to ensure both a high throughput of bored holes and a high hole quality. With the use of a Q-switched $CO_2$ laser, a wavelength of approximately 9.2 $\mu$m and a pulse energy of approximately 0.7 mJ are used. As a result, by way of example, 500 holes per second can be bored into an LCP substrate having a thickness of 0.4 mm. The high throughput and the simultaneously high hole quality are a consequence of the wavelength chosen, the short pulse lengths, the high repetition rate and the pulse energy that is likewise high compared with conventional laser processing apparatuses in the area of electronic fabrication.

32 Claims, 1 Drawing Sheet

METHOD AND APPARATUS FOR LASER PROCESSING

The present application hereby claims priority under 35 U.S.C. §119 on German patent application number 10209617.1 filed Mar. 5, 2002, the entire contents of which are hereby incorporated herein by reference.

FIELD OF THE INVENTION

The invention generally relates to a method and an apparatus for processing objects, in particular for rapidly processing dielectric substrates by use of laser beams.

BACKGROUND OF THE INVENTION

Material processing using laser beams has increasingly gained in importance due to the rapid development of laser technology in recent years. In the field of electronic fabrication, in particular, due to the increasing miniaturization of the components, laser processing of printed circuit boards or substrates has become an indispensable tool in order to enable the microstructuring of components and/or substrates that is required on account of the miniaturization of the components. Thus, by way of example, it is possible to bore holes into substrates which have a diameter which is significantly smaller than the hole diameters of holes bored by conventional boring devices. Assuming that the laser power of the laser beam impinging on the substrate is known exactly, it is possible to bore not only through holes but also so-called blind holes. These are important particularly for multilayer printed circuit boards since, by uses of a subsequent metallization of a blind hole, different metallic layers of the multilayer printed circuit board can be electrically conductively connected to one another and the integration density on a substrate can thus be significantly increased.

U.S. Pat. No. 5,593,606 discloses a laser processing apparatus which can be used to bore holes having a diameter of between 50 and 200 $\mu$m into multilayer substrates. The laser light source used is a continuously pumped, Q-switched Nd:YAG laser which, after frequency conversion, generates light pulses in the ultraviolet spectral region. The individual light pulses have a mean pulse power of approximately 250 mW and a pulse length of the order of magnitude of 100 ns. This results in a comparatively low energy of the individual light pulses of approximately 25 nJ, so that a multiplicity of laser pulses have to be used to bore a single hole. Moreover, since the pulse repetition frequency is limited to a few kHz, the throughput, i.e. the number of holes which can be bored per unit time, is correspondingly low, so that only a relatively small number of holes can be bored per unit time using this laser processing apparatus, depending on the material and the thickness of the layers that are to be bored through.

Furthermore, it is known that pulsed $CO_2$ lasers having a wavelength of 9.2–10.6 $\mu$m or pulsed solid-state lasers such as, for example, Nd:LYAG lasers or Nd:YVO$_4$ lasers having a fundamental wavelength of 1064 nm can be used for material processing and, in particular, also for boring holes into substrates. The use of such conventional $CO_2$ laser light sources emitting in the infrared spectral region has the disadvantage that the laser pulses generated are relatively long with a pulse length of the order of magnitude of $\mu$s. As a result, the substrate to be processed is exposed to a high thermal loading, so that the geometry of the bored holes deviates considerably from the optimum (cylindrical or conical) form due to a boring burr or due to depositions at the edge of the hole and the quality of the bored holes is thus reduced. The depositions arise for example as a result of solidified vapor generated beforehand by sublimation from the substrate material on account of the heating by the laser beam. The deposition may, however, also comprise small grains of the solid substrate material which are centrifuged on account of a high degree of inhomogeneous heating of the substrate at the edge of the hole.

SUMMARY OF THE INVENTION

An embodiment of the invention is based on an object of providing a method and an apparatus for boring holes into dielectric substrates, in the case of which a multiplicity of high-quality holes can be bored within a short period of time.

An embodiment of the invention is based on the insight that given suitable parameters, i.e. the wavelength, the pulse lengths, the repetition rate and the pulse energy of the processed laser beam, it is possible to improve both the throughput, i.e. the number of holes bored per unit time, and the resulting hole quality. Medium infrared spectral region is understood hereinafter to mean a wavelength of 1.2 $\mu$m to 7 $\mu$m and far infrared spectral region is understood to mean a wavelength of 7 $\mu$m to 1000 $\mu$m.

In accordance with one embodiment, a Q-switched $CO_2$ laser which emits light with a wavelength of approximately 9.2 $\mu$m is suitable for generating the pulsed laser beam. The Q-switching of the $CO_2$ laser can be realized by use of a so-called acousto-optical switch. By way of example, a CdTe crystal excited to effect mechanical oscillations with a frequency in the MHz range is suitable for this purpose.

Focusing of the processing laser beam onto a diameter of approximately 50 to 200 $\mu$m can be realized in particular when the laser beam emitted by the laser light source is widened by use of a beam expansion upstream of the actual focusing optical arrangement. It is pointed out that the use of a beam expansion results in a lower depth of field of the laser beam to be processed, so that the distance between the focusing optical arrangement and the object surface to be processed must be complied with, with the highest possible accuracy. Undesirable widening or conical geometries of the bored holes can be avoided in this way.

The boring of so-called blind holes is used in particular when processing multilayer substrates.

Depending on the substrate material and the thickness or the depth of the hole to be bored, the hole can be bored either by use of a single laser pulse or by use of a sequence of laser pulses that are directed successively onto the object to be processed. When using a sequence of a plurality of laser pulses, it must be taken into account that, in order to avoid a poor hole quality, the individual laser pulses impinge as far as possible at the same location on the object. Experiments that have been carried out have revealed that a spatial overlap of the resulting focus areas of at least 66% should be complied with for this purpose.

In accordance with one embodiment, pulses having a length of at most 150 ns are preferably used for the processing of substrates made of the substrate material LCP (Liquid Cristalline Polymer), which has outstanding electrical properties right up to frequencies of 40 GHz and which is virtually impermeable both to liquid, oxygen and to other gases and liquids.

In accordance with one embodiment, a pulse repetition frequency of at least 50 KHz, preferably a pulse repetition frequency of between 60 KHz and 100 KHz, is suitable for processing the dielectric substrate FR4 (Flame Retard 4) that is mechanically reinforced with a glass fiber material, such as the material C-1080 from the company ISOLA, by way of example.

In accordance with one embodiment, the processing of an epoxy material, such as the material RCC (Resin Coated Copper) that is often used as a standard substrate in electronic fabrication, by way of example, requires a pulse repetition frequency of at least 80 KHz and preferably a pulse repetition frequency of approximately 100 KHz.

BRIEF DESCRIPTION OF THE DRAWINGS

Further advantages and features of the present invention emerge from the following exemplary description of a presently preferred embodiment.

In the drawings.

DETAILED DESCRIPTION OF THE PREFERRED EMBODIMENTS

Figure 1:
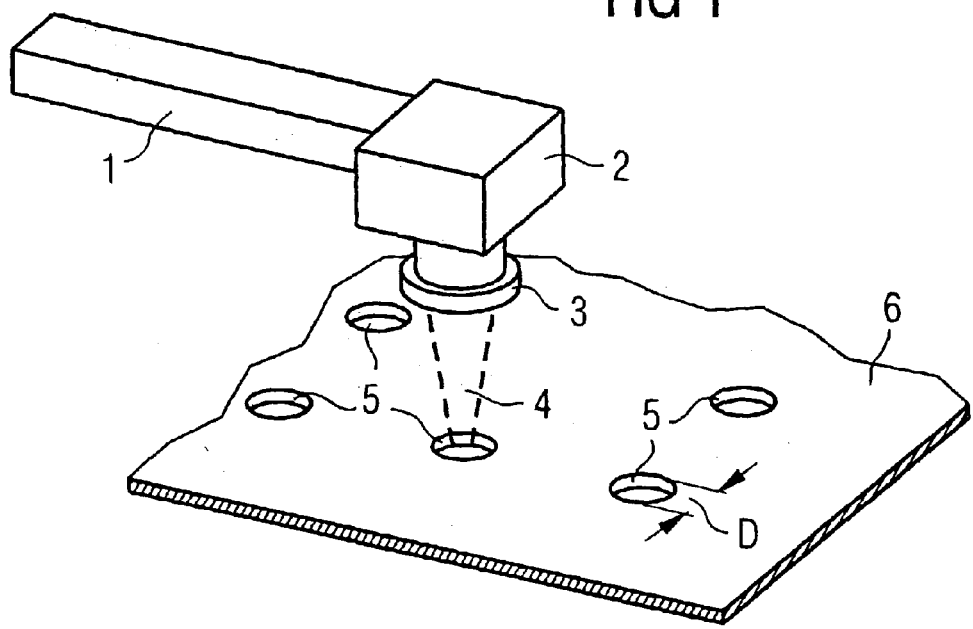
FIG. 1 shows the boring of holes through a substrate in a diagrammatic illustration.

In accordance with the exemplary embodiment of the invention, as illustrated in FIG. 1, the boring is effected by use of a laser processing apparatus by a procedure in which a laser beam emitted by a $CO_2$ laser (not illustrated) and having a wavelength of approximately 9.2±0.2 µm is expanded by use of a beam expander 1 in such a way that the diameter of the laser beam is enlarged by approximately a factor of 1.5 to 2 compared with the diameter of the laser beam at the coupling-out mirror of the laser. The expanded laser beam is deflected by approximately 90° by a deflection unit 2 containing at least two moveable mirrors (not illustrated). The deflected laser beam is then focused by means of a telecentric focusing optical arrangement 3 in such a way that a laser beam 4 having an effective focus diameter of approximately 100 µm to 200 µm is directed onto the object to be processed, which is a single-layer substrate 6 in accordance with the exemplary embodiment illustrated here. The two mirrors of the deflection unit 2 are mounted in such a way that the laser beam 4 can be directed onto any desired locations within a predetermined region on the surface of the substrate 6 within a short time.

The substrate 6 is produced from the material LCP. By way of example, this material is offered by the company Ticona under the designation Vectra H840 or by the company Dupont de Nemours under the designation Zenite 7738. It is pointed out, however, that other dielectric materials, such as, for example, FR4 or the epoxy material RCC, can also be used for the substrate.

The laser beam 4 generated by the Q-switched $CO_2$ laser light source (not illustrated) emits laser light pulses having a pulse duration of less than 150 ns and having a pulse energy of at least 0.7 mJ with a repetition frequency of at least 50 KHz. The diameter of the laser beam 4 impinging on the substrate 6 to be processed is approximately 100 µm to 200 µm. Holes 5 having a diameter of approximately 120 µm to 250 µm are bored in this way, the resulting hole quality being considerably improved compared with holes bored by conventional laser processing apparatuses.

It is pointed out that, in order to achieve a high throughput of bored holes, the imaging unit 2 must be designed in such a way that the laser beam 4 deflected onto the substrate 6 to be processed can be deflected quickly from one position that is defined as precisely as possible on the substrate surface to another position that is likewise defined as precisely as possible on the substrate surface. When using such a rapid deflection unit 2, it is thus possible, on account of the relatively large pulse energies, on account of the short pulse lengths and the wavelength of the laser beam 4 used, both to achieve a high throughput of bored holes and to minimize the thermal loading on the substrate material. Further, consequently, it is also possible to avoid a boring burr or depositions around the bored hole.

Figure 2:
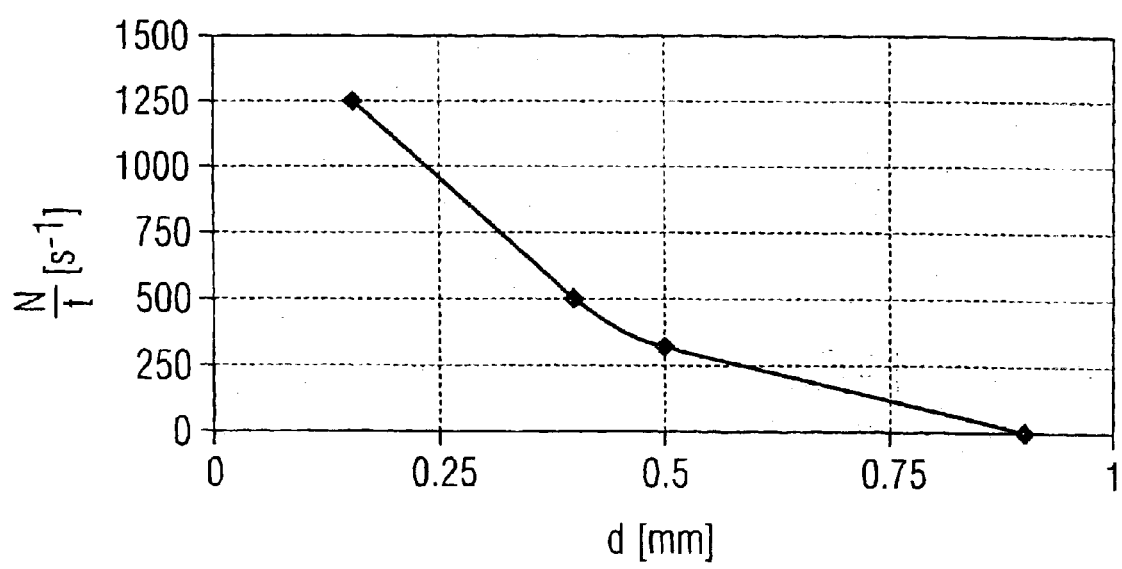
FIG. 2 shows a graphical representation of the maximum achievable throughput of bored holes as a function of the thickness of the LCP substrate used.

FIG. 2 shows the result of an experimental investigation in which the maximum number of holes which can be bored with a high hole quality is represented graphically as a function of the thickness of the substrate. In this case, the thickness d in the unit mm is plotted on the abscissa. The ordinate specifies the throughput N/t of holes bored per second. The substrate used is again produced from the material LCP. The thinner the LCP substrate that is to be bored through, the higher the throughput of bored holes. Given a thickness of 0.5 mm, it is possible to bore approximately 300 holes per second. Given a thickness of 0.4 mm, the number of holes which can be bored with a uniform quality increases to 500 per second. Given a thickness of 0.15 mm, the throughput of bored holes increases further up to 1250 holes per second.

It is pointed out that LCP substrates having a thickness of 0.4 mm are often used as so-called injection moulding substrates in electronic fabrication, so that the throughput of bored holes of 500 per second is considerably increased compared with the throughput which can be achieved with conventional laser processing machines.

To summarize, a method and an apparatus is provided for rapidly processing dielectric substrates 6 by use of laser beams. A pulsed laser beam 4 having a pulse repetition frequency greater than approximately 50 kHz and having pulse lengths shorter than approximately 200 ns is used for this purpose. Given a suitable choice of the parameters which characterize the processing laser beam, it is possible to ensure both a high throughput of bored holes 5 and a high hole quality. With the use of a Q-switched $CO_2$ laser, a wavelength of approximately 9.2 µm and a pulse energy of approximately 0.7 mJ are used. As a result, by way of example, 500 holes per second can be bored into an LCP substrate having a thickness of 0.4 mm. The high throughput and the simultaneously high hole quality are a consequence of the wavelength chosen, the short pulse lengths, the high repetition rate and the pulse energy that is likewise high compared with conventional laser processing apparatuses in the area of electronic fabrication.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for processing an object using a laser beam, comprising:

generating a pulsed laser beam using a laser light source emitting in at least one of the medium and far infrared spectral region, wherein the pulsed laser beam includes a pulse repetition frequency greater than approximately 50 kHz and includes pulse lengths shorter than approximately 200 ns; and deflecting the laser beam onto the object to be processed via a deflection unit.

2. The method as claimed in claim 1, wherein a Q-switched $CO_2$ laser is used for generating the pulsed laser beam.

3. The method as claimed in claim 1, wherein the pulsed laser beam includes a wavelength of approximately 9.2 μm.

4. The method as claimed in claim 1, wherein laser pulses having an approximate energy of at least $10^{-4}$ joule are used.

5. The method as claimed in claim 4, wherein laser pulses having an energy of approximately 0.7 mjoule are used.

6. The method as claimed in claim 1, wherein the laser beam is focused onto the object to be processed with an approximate diameter of 50 μm–200 μm.

7. The method as claimed in claim 1, wherein holes are bored into the object to be processed.

8. The method as claimed in claim 7, wherein a hole is bored using at least one of a single laser pulse and a plurality of laser pulses which are directed successively onto the object to be processed.

9. The method as claimed in claim 1, wherein an LCP substrate is processed and wherein the pulse lengths are shorter than approximately 150 ns.

10. The method as claimed in claim 1, wherein a dielectric substrate mechanically reinforced with a glass fiber material is processed, and wherein a pulse repetition frequency of at least 50 kHz is used.

11. The method as claimed in claim 1, wherein an epoxy material is processed, a pulse repetition frequency of at least 80 kHz is used.

12. A method for processing objects, comprising:

generating a pulsed laser beam using a laser light source emitting in at least one of the medium and far infrared spectral region, wherein the pulsed laser beam includes a pulse repetition frequency greater than approximately 50 kHz and pulse lengths shorter than approximately 200 ns; and deflecting the laser beam onto the object to be processed using a deflection unit.

13. The method as claimed in claim 2, wherein the pulsed laser beam includes a wavelength of approximately 9.2 μm.

14. The method as claimed in claim 2, wherein laser pulses having an approximate energy of at least $10^{-4}$ joule are used.

15. The method as claimed in claim 3, wherein laser pulses having an approximate energy of at least $10^{-4}$ joule are used.

16. The method as claimed in claim 2, wherein the laser beam is focused onto the object to be processed with an approximate diameter of 50 μm–200 μm.

17. The method as claimed in claim 2, wherein holes are bored into the object to be processed.

18. The method as claimed in claim 3, wherein the laser beam is focused onto the object to be processed with an approximate diameter of 50 μm–200 μm.

19. The method as claimed in claim 7, wherein blind holes are bored into the object to be processed.

20. The method as claimed in claim 3, wherein holes are bored into the object to be processed.

21. The method as claimed in claim 17, wherein blind holes are bored into the object to be processed.

22. The method as claimed in claim 20, wherein blind holes are bored into the object to be processed.

23. The method as claimed in claim 19, wherein a hole is bored using at least one of a single laser pulse and a plurality of laser pulses which are directed successively onto the object to be processed.

24. The method as claimed in claim 2, wherein an LCP substrate is processed and wherein the pulse lengths are shorter than approximately 150 ns.

25. The method as claimed in claim 2, wherein a dielectric substrate mechanically reinforced with a glass fiber material is processed, and wherein a pulse repetition frequency of at least 50 kHz is used.

26. The method as claimed in claim 3, wherein an LCP substrate is processed and wherein the pulse lengths are shorter than approximately 150 ns.

27. The method as claimed in claim 3, wherein a dielectric substrate mechanically reinforced with a glass fiber material is processed, and wherein a pulse repetition frequency of at least 50 kHz is used.

28. The method as claimed in claim 1, wherein a dielectric substrate mechanically reinforced with a glass fiber material is processed, and wherein a pulse repetition frequency of approximately 60 kHz to approximately 100 kHz is used.

29. The method as claimed in claim 1, wherein an epoxy material is processed, and a pulse repetition frequency of approximately 100 kHz is used.

30. The method as claimed in claim 2, wherein an epoxy material is processed, and a pulse repetition frequency of at least 80 kHz is used.

31. The method as claimed in claim 3, wherein an epoxy material is processed, and a pulse repetition frequency of at least 80 kHz is used.

32. The method of claim 12, wherein the method is for rapidly processing dielectric substrates by use of laser beams.

* * * * *